United States Patent

Iwanaga et al.

Patent Number: 6,120,972
Date of Patent: Sep. 19, 2000

[54] RADIATION-SENSITIVE RESIN COMPOSITION

[75] Inventors: Shin-ichiro Iwanaga; Eiichi Kobayashi; Takayoshi Tanabe; Kazuo Kawaguchi, all of Yokkaichi, Japan

[73] Assignee: JSR Corporation, Tokyo, Japan

[21] Appl. No.: 09/136,051

[22] Filed: Aug. 18, 1998

[30] Foreign Application Priority Data

Sep. 2, 1997 [JP] Japan ................................ 9-251449

[51] Int. Cl.⁷ .................................................. G03F 7/004
[52] U.S. Cl. .................................. 430/270.1; 430/286.1; 430/288.1
[58] Field of Search ........................ 430/288.1, 270.1, 430/286.1

[56] References Cited

FOREIGN PATENT DOCUMENTS

| 0 422 628 A2 | 4/1991 | European Pat. Off. . |
|---|---|---|
| 2-27660 | 3/1990 | Japan . |
| 2-161436 | 7/1990 | Japan . |
| 5-249682 | 9/1993 | Japan . |
| 7-140666 | 10/1995 | Japan . |

OTHER PUBLICATIONS

M–Y. Li, et al., Journal of Imaging Science, vol. 34, No. 6, pp. 259–264, "Imaging by Photodecoupling of Crosslinks in Polymer Gels", Nov./Dec. 1990.

March, Jerry, Advanced Organic Chemistry 4th ed., John Wiley & Sons, NY, 1992, p. 392.

*Primary Examiner*—Janet Baxter
*Assistant Examiner*—Rosemary Ashton
*Attorney, Agent, or Firm*—Oblon, Spivak, McClelland, Maier & Neustadt, P.C.

[57] ABSTRACT

A radiation-sensitive resin composition comprising (A) a copolymer which comprises (a) a repeating unit (I) formed by cleavage of a carbon—carbon double bond of a monomer having one polymerizable carbon—carbon double bond and (b) a repeating unit (II) formed by cleavage of a carbon—carbon double bond of a monomer having two or more polymerizable carbon—carbon double bonds and at least one divalent group decomposed by an acid of the following formulas (1) or (2),

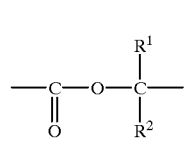

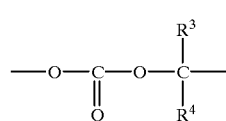

wherein $R^1$, $R^2$, $R^3$ and $R^4$ are an alkyl group having 1–5 carbon atoms or an aryl group having 6–14 carbon atoms individually, said monomer having a structure in which each carbon—carbon double bond combines via said divalent group, and (B) a photoacid generator. The radiation-sensitive resin composition exhibits excellent sensitivity and resolution, fewer effect from the swing curves, excellent pattern profile, and superior heat resistance, high sensitivity to ultraviolet rays, far ultraviolet rays, X-rays, and various types of radiation such as charged particle rays, and is useful as a chemically amplified positive tone resist used in the manufacture of integrated circuit devices.

23 Claims, No Drawings

RADIATION-SENSITIVE RESIN COMPOSITION

BACKGROUND OF THE INVENTION

1. Field of the Invention

The present invention relates to a radiation-sensitive resin composition. More particularly, the present invention relates to a radiation-sensitive resin composition suitably used as a chemically amplified positive-tone resist useful for microfabrication using ultraviolet rays, far ultraviolet rays, X-rays, and various other types of radiation such as charged particle rays.

2. Prior Art

In the field of microfabrication represented by the manufacture of an integrated circuit device, design rules for the lithographic process have been rapidly miniaturized in order to achieve a higher circuit integration. In recent years, a lithography process in which microfabrication of line width of 0.5 µm or less can be carried out stably and with higher accuracy has been positively developed.

However, according to conventional methods using visible rays (wavelength: 700–400 nm) or near ultraviolet rays (wavelength: 400–300 nm), it has been difficult to form such a fine pattern with precision. Because of this, a lithography process using shorter wavelength radiation (wavelength: 300 nm or below), which ensures a wider depth of focus and finer dimensions for design rules, has been proposed.

As a lithography process using such shorter wavelength radiations, a method using far ultraviolet rays such as a KrF excimer laser (wavelength: 248 nm) and ArF excimer laser (wavelength: 193 nm) and a method using X-rays such as synchrotron radiation or charged particle rays such as electron beams have been proposed. In addition, International Business Machines Corporation (IBM) has proposed a "chemically amplified resist" as a high resolution resist corresponding to these shorter wavelength radiations. Up until the present, development and improvement of the chemically amplified resist has been energetically pursued.

A photoacid generator contained in the chemically amplified resist generates an acid on exposure to radiation, and the acid acts as a catalyst to cause chemical reactions such as alteration of polarity, cleavage of a chemical bond, and crosslinking reaction in the resist film to form a resist pattern by utilizing the change in solubility of the exposed part in a developer.

As a conventionally proposed chemically amplified resist exhibiting relatively good performances as a resist, the following resists have been proposed: a resist using a resin in which an alkali affinitive group in an alkali-soluble resin is protected by a t-butyl ester group or a t-butoxycarbonyl group (Japanese Patent Publication No. 27660/1990); a resist using a resin in which an alkali affinitive group in an alkali-soluble resin is protected by a ketal group (Japanese Patent Application Laid-open No. 140666/1995); and a resist using a resin in which an alkali affinitive group in an alkali-soluble resin is protected by an acetal group (Japanese Patent Application Laid-open No. 161436/1990 and No. 249682/1993).

However, it has been pointed out that these chemically amplified resists have respective characteristic problems, whereby the practical use is accompanied by various difficulties.

One of the fatal problems is irregular line widths of the resist pattern or a T-shaped resist pattern due to the time delay (Post Exposure Time Delay, hereinafter called "PED") between irradiation and the bake process (hereinafter called "post-bake").

In addition to the above problem, because resolution, bake temperature, and the like are highly dependent on the PED, process stability becomes insufficient, whereby further improvement of the overall characteristics of the chemically amplified resist has been required.

Among the above chemically amplified resists, a positive tone resist comprising a copolymer of hydroxystyrene and t-butyl acrylate as the resin component (hereinafter called "type ①") and a positive tone resist containing a resin in which a phenolic hydroxyl group of a poly(hydroxystyrene) is protected by a ketal group or an acetal group (hereinafter called "type ②") have proposed as resists which overcome the above problems to some degree.

However, because the resist of the type ① contains an acrylic component whose absorption coefficient is small at a wavelength of 248 nm, the effect of swing curves becomes greater, thereby exhibiting an impaired pattern profile and inferior resolution. Moreover, the resist of the type ② exhibits lower heat resistance, giving rise to impaired pattern profiles. As described above, these resists can not satisfy properties such as high resolution and superior heat resistance, which have been required for the recent increasing demand for microfabrication.

The present invention has been achieved in view of the above situation, and, in particular, as a result of considering a resin component which constitutes a chemically amplified resist in more detail. The object of the present invention is to provide a radiation-sensitive resin composition suitably used as a chemically amplified positive tone resist which is sensitive to various types of radiation and exhibits excellent sensitivity and resolution, fewer effects from swing curves, excellent pattern profile, and superior heat resistance.

SUMMARY OF THE INVENTION

According to the present invention, the above object can be achieved by a radiation-sensitive resin composition comprising:

(A) a copolymer which comprises (a) a repeating unit (I) formed by cleavage of a carbon—carbon double bond of a monomer having one polymerizable carbon—carbon double bond and (b) a repeating unit (II) formed by cleavage of a carbon—carbon double bond of a monomer having two or more polymerizable carbon—carbon double bonds and at least one divalent group decomposed by an acid of the following formulas (1) or (2),

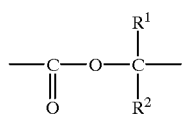

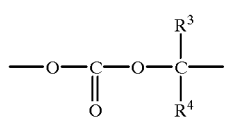

wherein $R^1$, $R^2$, $R^3$ and $R^4$ are an alkyl group having 1–5 carbon atoms or an aryl group having 6–14 carbon atoms individually, said monomer having a structure in which each carbon—carbon double bond combines via said divalent group, and (B) a photoacid generator.

Other objects, features and advantages of the invention will hereinafter become more readily apparent from the following description.

DETAILED DESCRIPTION OF THE INVENTION AND PREFERRED EMBODIMENTS

The present invention will now be described in detail.

Copolymer (A)

The copolymer (A) of the present invention is a copolymer containing the above repeating units (I) and (II).

As examples of the repeating unit (I), a repeating unit which provides alkali-solubility for the copolymer (A) (hereinafter called "repeating unit (I-1)"), a repeating unit which provides alkali-solubility for the copolymer (A) by decomposition with an acid (hereinafter called "repeating unit (I-2)"), a repeating unit which suppresses alkali-solubility of the copolymer (A) (hereinafter called "repeating unit (I-3)"), and the like can be given.

As examples of a monomer (hereinafter called "monomer (I-1)") providing the repeating unit (I-1), a monomer having an acidic functional group such as a carboxyl group and a phenolic hydroxyl group can be given.

Of these, specific examples of the monomer (I-1) having a carboxyl group include (meth)acrylic acid, crotonic acid, cinnamic acid, maleic acid, fumaric acid, itaconic acid, 2-(meth)acryloyloxyethylcarboxylic acid, 4-(meth)acryloyloxycyclohexylcarboxylic acids, and the like. Specific examples of the monomer (I-1) having a phenolic hydroxyl group include o-hydroxystyrene, m-hydroxystyrene, p-hydroxystyrene, o-isopropenyl phenol, m-isopropenyl phenol, p-isopropenyl phenol, and the like.

These monomers (I-1) can be used either individually or in combinations of two or more.

As examples of a monomer (hereinafter called "monomer (I-2)") providing the repeating unit (I-2), a monomer which forms an acidic functional group such as a carboxyl group and a phenolic hydroxyl group by decomposition with an acid can be given.

Of these monomers, specific examples of the monomer (I-2) forming a carboxyl group by decomposition by an acid include (meth)acrylates protected by an acid decomposable ester group, for example, t-butyl (meth)acrylate, tetrahydropyranyl (meth)acrylate, 2-methoxyethyl (meth)acrylate, 2-ethoxyethyl (meth)acrylate, 2-t-butoxycarbonylethyl (meth)acrylate, 2-cyanoethyl (meth)acrylate, o-(t-butoxycarbonylmethoxy)styrene, m-(t-butoxycarbonylmethoxy)styrene, p-(t-butoxycarbonylmethoxy)styrene, hydroxy($\alpha$-methyl) styrene derivatives protected by an acid decomposable ester group such as $\alpha$-methyl substituents of these compounds, and the like.

As specific examples of the monomer (I-2) which forms a phenolic hydroxyl group by decomposition with an acid, p-(1-methoxyethoxy)styrene, p-(1-ethoxyethoxy)styrene, p-(1-n-propoxyethoxy)styrene, p-(1-i-propoxyethoxy)styrene, p-(1-cyclohexyloxyethoxy)styrene, p-(1-isobornyloxyethoxy)styrene, hydroxy($\alpha$-methyl) styrenes protected by an acetal group such as $\alpha$-methyl substituents of these compounds, p-acetoxystyrene, p-t-butoxycarbonyloxystyrene, p-t-butoxystyrene, $\alpha$-methyl substituents of these compounds, and the like can be given.

These monomers (I-2) can be used either individually or in combinations of two or more.

Examples of a monomer providing the repeating unit (I-3) (hereinafter called "monomer (I-3)") include: aromatic vinyl compounds such as styrene, $\alpha$-methylstyrene, p-methylstyrene, p-chlorostyrene, and p-methoxystyrene; hetero atom-containing alicyclic vinyl compounds such as N-vinyl pyrrolidone and N-vinyl caprolactam; cyano group-containing vinyl compounds such as (meth)acrylonitrile and cyano vinylidene; (meth)acrylamides (derivatives) such as (meth)acrylamide, N,N-dimethyl (meth)acrylamide, and N,N-dimethylol (meth)acrylamide; methyl (meth)acrylate, ethyl (meth)acrylate, n-propyl (meth)acrylate, i-propyl (meth)acrylate, 2-hydroxyethyl (meth)acrylate, 2-hydroxypropyl (meth)acrylate, 3-hydroxypropyl (meth)acrylate, phenyl (meth)acrylate, cyclohexyl (meth)acrylate, benzyl (meth)acrylate, isobornyl (meth)acrylate, tricyclodecanyl (meth)acrylate, and the like.

These monomers (I-3) can be used either individually or in combinations of two or more.

As the repeating unit (I) of the present invention, the repeating unit (I-2), in particular, t-butyl (meth) arylate, tetrahydropyranyl (meth)acrylate, p-(1-ethoxyethoxy) styrene, p-t-butoxycarbonyloxystyrene, p-t-butoxystyrene, or the like is preferable.

The content of the repeating unit (I-2) in the repeating unit (I) is usually 20 wt % or more, preferably 20–60 wt %, and particularly preferably 25–50 wt %.

The repeating unit (I) can be used either individually or in combinations of two or more in the copolymer (A).

The content of the repeating unit (I) in the copolymer (A) is usually 60–99 wt %, preferably 70–98 wt %, and more preferably 75–97 wt %. If the content is less than 60 wt %, resolution as a resist may be degraded. On the other hand, if the content exceeds 99 wt %, in consequence the amount of the repeating unit (II) decreases relatively, whereby sensitivity, adhesion to a substrate, and the like as a resist may be insufficient.

The repeating unit (II) has the function of restraining thermal decomposition and improving heat resistance by introducing appropriate branched structures to the copolymer (A) thereby degrading the movement of a molecular chain of the polymer, and the function of lowering the molecular weight of the copolymer (A) by decomposing with an acid. Moreover, the viscosity of the polymer solution can be maintained lower than that of a linear polymer solution owing to the branched structures introduced by the repeating unit (II). As a result, heat resistance as well as resolution as a resist of the copolymer (A) can be improved owing to the higher molecular weight of the copolymer (A). In addition, because the repeating unit (II) has a specific group decomposed by an acid, the branched structure in the copolymer (A) is destroyed, whereby the molecular weight of the copolymer (A) becomes lower. Because of this, the copolymer (A) exhibits higher solubility in the presence of acids and greatly improved resolution as a resist.

A monomer providing the repeating unit (II) (hereinafter called "monomer (II)") is a monomer having at least one divalent ester group of the above formula (1) (hereinafter called "ester group (1)") or one divalent carbonate group of the above formula (2) (hereinafter called "carbonate group (2)").

Of these monomers, the monomer (II) having an ester group (1) can be synthesized, for example, by esterification of a polyhydric alcohol having at least one tertiary hydroxyl group and a monovalent carboxylic acid having one polymerizable carbon—carbon double bond.

The above esterification can be carried out by using the following methods ①–④:

① reacting acid chloride of the carboxylic acid compound with the polyhydric alcohol;

② reacting the polyhydric alcohol with the carboxylic acid compound by using a condensing agent such as dicyclohexylcarbodiimide;

③ reacting the polyhydric alcohol with the carboxylic acid compound by using an anhydride of a strong acid such as trifluoroacetic acid as a dehydrating agent; and ④ a transesterification between the polyhydric alcohol and an ester of the carboxylic acid compound.

As examples of the polyhydric alcohol having a tertiary hydroxyl group, which is used for the synthesis of the monomer (II) having an ester group (1), compounds of the following general formulas (3)–(5) and the like can be given:

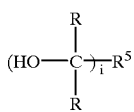
(3)

wherein Rs are the same groups as $R^1$, $R^2$, $R^3$, and $R^4$ defined for the formulas (1) and (2), provided that a plural R may be the same or different, $R^5$ is an organic group with a valence of i, provided that $R^5$ is a single bond when i=2, and i is an integer from 2–4;

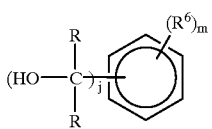
(4)

wherein Rs are the same groups as $R^1$, $R^2$, $R^3$, and $R^4$ defined for the formulas (1) and (2), provided that a plural R may be the same or different, $R^6$ is an alkyl group having 1–5 carbon atoms, provided that a plural $R^6$ may be the same or different, j is an integer of 2–4, and m is an integer from 0–4, provided that j and m satisfy the relation of $j+m \leq 6$;

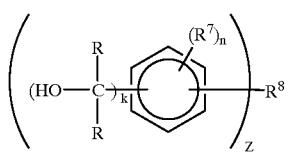
(5)

wherein Rs are the same groups as $R^1$, $R^2$, $R^3$, and $R^4$ defined for the formulas (1) and (2), provided that a plural R may be the same or different, $R^7$ is an alkyl group having 1–5 carbon atoms, provided that a plural $R^7$ may be the same or different, $R^8$ is an organic group with a valence of z, —O—, —S—, —CO—, or —$SO_2$—, k is an integer from 1–2, n is an integer from 0–3, and z is an integer from 2–4.

Examples of the compound of the formula (3) include: tertiary diols such as 2,3-dimethyl-2,3-butanediol, 2,3-diethyl-2,3-butanediol, 2,3-di-n-propyl-2,3-butanediol, 2,3-diphenyl-2,3-butanediol, 2,4-dimethyl-2,4-pentanediol, 2,4-diethyl-2,4-pentanediol, 2,4-di-n-propyl-2,4-pentanediol, 2,4-diphenyl-2,4-pentanediol, 2,5-dimethyl 2,5-hexanediol, 2,5-diethyl-2,5-hexanediol, 2,5-di-n-propyl-2,5-hexanediol, 2,5-diphenyl-2,5-hexanediol, 2,6-dimethyl-2,6-heptanediol, 2,6-diethyl-2,6-heptanediol, 2,6-di-n-propyl-2,6-heptanediol, and 2,6-diphenyl-2,6-heptanediol; secondary triols such as 2,4-dimethyl-2,4-dihydroxy-3-(2-hydroxypropyl)pentane, 2,4-diethyl-2,4-dihydroxy-3-(2-hydroxypropyl)pentane, 2,5-dimethyl-2,5-dihydroxy-3-(2-hydroxypropyl)hexane, and 2,5-diethyl-2,5-dihydroxy-3-(2-hydroxypropyl)hexane; tertiary tetraols such as 2,4-dimethyl-2,4-dihydroxy-3,3-di(2-hydroxypropyl)pentane, 2,4-diethyl-2,4-dihydroxy-3,3-di(2-hydroxypropyl)pentane, 2,5-dimethyl-2,5-dihydroxy-3,4-di(2-hydroxypropyl)hexane, and 2,5-diethyl-2,4-dihydroxy-3,4-di(2-hydroxypropyl)hexane; and the like.

As examples of the compound of the formula (4), 1,4-di (2-hydroxypropyl)benzene, 1,3-di (2-hydroxypropyl)benzene, 1,3,5-tri(2-hydroxypropyl)benzene, 1,2,4,5-tetra (2-hydroxypropyl)benzene, and the like can be given.

As examples of the compound of the formula (5), 2,2-bis [4-(2-hydroxypropyl)phenyl]propane, 1,2,2-tris[4-(2-hydroxypropyl)phenyl]propane, 1,2,3,4-tetra[4-(2-hydroxypropyl)phenyl]butane, bis[4-(2-hydroxypropyl) phenyl]ether, bis[4-(2-hydroxypropyl)phenyl]sulfide, bis[4-(2-hydroxypropyl)phenyl]ketone, bis[4-(2-hydroxypropyl) phenyl]sulfone, and the like can be given.

Of these dihydric, trihydric, and tetrahydric tertiary alcohols of the formulas (3)–(5), 2,5-dimethyl-2,5-hexanediol, 1,4-di(2-hydroxypropyl)benzene, 1,3-di(2-hydroxypropyl) benzene, and the like are particularly preferable.

As examples of the monovalent carboxylic acid having one polymerizable carbon—carbon double bond, which is used for the synthesis of the monomer (II) having the ester group (1), the monomers having a carboxyl group, which are used as the monomer (I-1), and the like can be given.

The monomer (II) having the carbonate group (2) can be synthesized by, for example, converting a polyhydric alcohol having at least one tertiary hydroxyl group into a poly(chloroformate) by phosgene and the like, then reacting this compound with a monohydric alcohol having one polymerizable carbon—carbon double bond.

As examples of the polyhydric alcohols having at least one tertiary hydroxyl group used for synthesizing the monomer (II) having the carbonate group (2), dihydric, trihydric, and tetrahydric tertiary alcohols of the formulae (3) to (5) used for synthesizing the monomer (II) having the ester group (1) can be given.

Of these, 2,5-dimethyl-2,5-hexanediol, 1,4-di(2-hydroxypropyl)benzene, 1,3-di(2-hydroxypropyl)benzene, and the like are particularly preferable.

As examples of the monohydric alcohols having one polymerizable carbon—carbon double bond used for synthesizing the monomer (II) having the carbonate group (2), hydroxystyrenes such as o-hydroxystyrene, m-hydroxystyrene, p-hydroxystyrene, c-isopropenyl phenol, m-isopropenyl phenol, and p-isopropenyl phenol, hydroxyalkyl (meth)acrylates such as 2-hydroxyethyl (meth) acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth) acrylate, and the like can be given.

The repeating unit (II) can be used either singly or in combinations of two or more in the copolymer (A).

The content of the repeating unit (II) used in the copolymer (A) is usually 1–40 wt %, preferably 2–30 wt %, and particularly preferably 3–25 wt %. If the content of the repeating unit (II) is less than 1 wt %, sensitivity as a resist and adhesion to a substrate may be insufficient. On the other hand, if the content exceeds 40 wt %, resolution as a resist may be degraded.

The copolymer (A) can be synthesized by, for example, the following methods (a) to (c):

(a) copolymerizing the monomer (I) and the monomer (II) directly;

(b) copolymerizing p-acetoxystyrene and the monomer (II), optionally together with the monomer (I) other than p-acetoxystyrene, followed by hydrolysis under basic conditions to obtain the copolymer of p-hydroxystyrene and the monomer (II), which may contain the monomer (I) other than p-acetoxystyrene;

(c) protecting at least one portion of the phenolic hydroxyl groups of the copolymer obtained by the above method (b) with a group which is decomposed by an acid such as a 1-ethoxyethoxy group or a t-butoxycarbonylcxy group.

Polymerization in the methods (a)–(c) can be carried out by using a conventionally known method in which polymerization initiators, molecular weight modifiers, and the like are used.

As examples of the above polymerization initiators, benzoyl peroxide, lauroyl peroxide, 2,2'-azobisisobutyronitrile, 4,4'-azobis(4-cyanovaleric acid), 2,2'-azobis(4-methoxy-2,4-dimethylvaleronitrile), and the like can be given.

These polymerization initiators can be used either individually or in combinations of two or more.

As examples of the molecular weight modifiers, halogenated hydrocarbons such as carbon tetrachloride, chloroform, and carbon tetrabromide, mercaptans such as n-hexylmercaptan, n-octylmercaptan, n-dodecylmercaptan, t-dodecylmercaptan, thioglycollic acid, and thiopropionic acid, xanthogens such as dimethylxanthogen disulfide, and diisopropylxanthogen disulfide, terpinolene, α-methylstyrene dimer, and the like can be given.

These molecular weight modifiers can be used either individually or in combinations of two or more.

The polystyrene-reduced weight average molecular weight (hereinafter called "Mw") of the copolymer (A) determined by gel permeation chromatography (GPC) is usually 10,000–500,000, preferably 15,000–200,000, and particularly preferably 20,000–150,000. If the Mw of the copolymer (A) is less than 10,000, sensitivity, heat resistance, and the like as a resist may be insufficient. On the other hand, if the Mw exceeds 500,000, solubility in developers may be adversely affected.

The ratio of the Mw to the polystyrene-reduced number average molecular weight (hereinafter called "Mn") determined by gel permeation chromatography (GPC) of the copolymer (A) (Mw/Mn) is usually 1.5–10.0, and preferably 2.0–5.0.

In the present invention, the copolymer (A) can be used either individually or in combinations of two or more.

Photoacid Generator (B)

The photoacid generator (B) used in the present invention is a compound which generates acids by irradiation (hereinafter called "exposure").

As examples of the photoacid generator (B), ① onium salt compound, ② sulfone compound, ③ sulfonate compound, ④ sulfonimide compound, ⑤ diazomethane compound, and the like can be given.

① Onium Salt Compound

As the onium salt compounds, iodonium salt, sulfonium salt, phosphonium salt, diazonium salt, ammonium salt, pyridinium salt, and the like can be given.

Specific examples of the onium salt compounds include diphenyliodonium trifluoromethanesulfonate, diphenyliodonium nonafluorobutanesulfonate, diphenyliodonium pyrenesulfonate, diphenyliodonium dodecylbenzenesulfonate, diphenyliodonium hexafluoroantimonate, bis(4-t-butylphenyl)iodonium trifluoromethanesulfonate, bis(4-t-butylphenyl)iodonium nonafluorobutanesulfonate, bis(4-t-butylphenyl)iodonium camphorsulfonate, bis(4-t-butylphenyl)triphenylsulfonium trifluoromethanesulfonate, triphenylsulfonium nonafluorobutanesulfonate, triphenylsulfonium camphorsulfonate, triphenylsulfonium naphthalenesulfonate, 4-hydroxydiphenylbenzylmethylsulfonium p-toluenesulfonate, and the like.

② Sulfone Compound

As the sulfone compounds, β-ketosulfone, β-sulfonylsulfone, α-diazo compounds of these compounds, and the like can be given.

As specific examples of the sulfone compounds, phenacylphenylsulfone, mesitylphenacylsulfone, bis(phenylsulfonyl)methane, 4-trisphenacylsulfone, and the like can be given.

③ Sulfonate Compound

As the sulfonate compounds, alkylsulfonate, haloalkylsulfonate, arylsulfonate, iminosulfonate, and the like can be given.

As specific examples of the sulfonate compounds, benzointosylate, pyrogalloltristrifluoromethanesulfonate, pyrogallolmethanesulfonic acid triester, nitrobenzyl-9,10-diethoxyanthracene-2-sulfonate, α-methylolbenzointosylate, α-methylolbenzoinoctanesulfonate, α-methylolbenzointrifluoromethanesulfonate, α-methylolbenzoindodecylsulfonate, and the like can be given.

④ Sulfonimide Compound

As the sulfonimide compounds, compounds of the following formula (6) can be given:

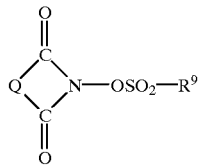

(6)

wherein Q is a divalent group, for example, an alkylene group, arylene group, or alkoxylene group, and $R^9$ is amonovalent group, for example, an alkyl group, aryl group, halogen-substituted alkyl group, or halogen substituted aryl group.

Specific examples of the sulfonimide compounds include N-(trifluoromethylsulfonyloxy)succinimide, N-(trifluoromethylsulfonyloxy)phthalimide, N-(trifluoromethylsulfonyloxy)diphenylmalelmide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptane-5,6-oxy-2,3-dicarboximide, N-(trifluoromethylsulfonyloxy)naphthylimide, N-(camphorsulfonyloxy)succinimide, N-(camphorsulfonyloxy)pphthalimide, N-(camphorsulfonyloxy)diphenylmaleimide, N-(camphorsulfonyloxy)bicyclo[2.2.1]hept-5-ene-2,3-dicarboximide, N-(camphorsulfonyloxy)-7-oxabicyclo[2.2.1]hept-5-ene-2,3-dicarboximide, N-(camphorsulfonyloxy)bicyclo[2.2.1]heptane-5,6-oxy-2,3-dicarboximide, N-(camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3- dicarboximide, N-(4-methylphenylsulfonyloxy)-7-oxabicyclo[2.2.1]hept-5-ene-2,3-dicarboximide, N-(4-methylphenylsulfonyloxy)bicyclo[2.2.1]heptane-5,6-oxy-2,3-dicarboximide, N-(4-methylphenylsulfonyloxy) naphthylimido, N-(2-trifluoromethylphenylsulfonyloxy) succinimide, N-(2-trifluoromethylphenylsulfonyloxy) phthalimide, N-(2-trifluoromethylphenylsulfonyloxy) diphenylmaleimide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1] hept-5-ene-2,3-dicarboximide, N-(2-trifluoromethylphenylsulfonyloxy)bicyclo[2.2.1]heptane-5,6-oxy-2,3-dicarboximide, N-(2-trifluoromethylphenylsulfonyloxy)naphthylimide, N-(4-fluorophenylsulfonyloxy)succinimide, N-(4-fluorophenylsulfonyloxy)phthalimide, N-(4-fluorophenylsulfonyloxy)diphenylmaleimide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxy)bicyclo[2.2.1]heptane-5,6-oxy-2,3-dicarboximide, N-(4-fluorophenylsulfonyloxy) naphthylimide, and the like.

⑤ Diazomethane Compound

As the diazomethane compounds, compounds of the following formula (7) can be given:

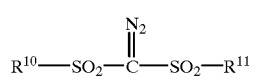

(7)

wherein $R^{10}$ and $R^{11}$ are monovalent groups such as an alkyl group, aryl group, halogen-substituted alkyl group, and halogen-substituted aryl group independently.

As specific examples of the diazomethane compounds, bis(trifluoromethylsulfonyl)diazomethane, bis(cyclohexylsulfonyl)diazomethane, bis(phenylsulfonyl) diazomethane, bis(p-toluenesulfonyl)diazomethane, methylsulfonyl-p-toluenesulfonyldiazomethane, 1-cyclohexylsulfonyl-1-(1,1-dimethylethylsulfonyl) diazomethane, bis(1,1-dimethylethylsulfonyl) diazomethane, and the like can be given.

Of these photoacid generators (B), ① onium salt compounds, ③ sulfonate compounds, ④ sulfonimide compounds, and ⑤ diazomethane compound are preferable. Specifically, triphenylsulfonium trifluoromethanesulfonate, triphenylsulfonium nonafluorobutanesulfonate, bis(4-t-butylphenyl)iodonium nonafluorobutanesulfonate, bis(4-t-butylphenyl)iodonium camphorsulfonate, bis(4-t-butylphenyl)iodonium p-toluenesulfonate, α-methylolbenzointosylate, α-methylolbenzoinoctanesulfonate, α-methylolbenzointrifluoromethanesulfonate, α-methylolbenzoindodecylsulfonate, pyrogallolmethanesulfonic acid triester, N-(trifluoromethylsulfonyloxy) bicyclo[2.2.1]hept-5-ene-2,3-dicarboximide, N-(camphorsulfonyloxy)bicyclo[2.2.1]hept-5-ene-2,3-dicarboximide, N-(camphorsulfonyloxy)naphthylimido, bis (cyclohexylsulfonyl)diazomethane, and the like are particularly preferable.

In the present invention, the photoacid generator (B) can be used either individually or in combinations of two or more.

The amount of the photoacid generator (B) is usually 1–20 parts by weight, and preferably 1–10 parts by weight for 100 parts by weight of the copolymer (A). If the amount is less than 1 part by weight, chemical changes owing to the catalytic action of acids generated by the exposure may be insufficient. On the other hand, the use of more than 20 parts by weight may cause uneven application or development residue (scum) at the time of development.

Acid Diffusion Controller

In the present invention, it is preferable to use an acid diffusion controller which, for example, inhibits diffusion of acids generated from the exposed photoacid generator (B) in the resist film, whereby undesirable chemical reactions in the unexposed area can be suppressed. By using the acid diffusion controllers, storage stability of the composition as well as resolution as a resist are improved and line width variation of a resist pattern caused by the PED can be restrained, whereby the highly stable process can be ensured.

As such acid diffusion controllers, nitrogen-containing organic compounds whose basicity can not be affected by exposure or baking can be preferably used. As specific examples of the nitrogen-containing organic compounds, compounds of the following formula (hereinafter called "nitrogen-containing compound (α)"),

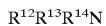

wherein $R^{12}$, $R^{13}$, and $R^{14}$ are a hydrogen atom, alkyl group, aryl group, or aralkyl group independently, diamino compounds having two nitrogen atoms in the molecule (hereinafter called "nitrogen-containing compound (β)"), polymers having more than three nitrogen atoms (hereinafter called "nitrogen-containing compound (γ)"), amide group-containing compounds, urea compounds, nitrogen-containing heterocyclic compounds, and the like can be given.

Examples of the nitrogen-containing compound (α) include monoalkylamines such as n-hexylamine, n-heptylamine, n-octylamine, n-nonylamine, and n-decylamine, dialkylamines such as di-n-butylamine, di-n-pentylamine, di-n-hexylamine, di-n-heptylamine, di-n-octylamine, di-n-nonylamine, and di-n-decylamine, trialkylamines such as triethylamine, tri-n-propylamine, tri-n-n-butylamine, tri-n-pentylamine, tri-n-hexylamine, tri-n-heptylamine, tri-n-octylamine, tri-n-nonylamine, tri-n-decylamine, tri-n-dodecylamine, and n-dodecyldimethylamine, and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine.

As examples of the nitrogen-containing compound (β), ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like can be given.

As examples of the nitrogen-containing compound (γ), polyethyleneimine, polyallylamine, polymer of dimethylaminoethylacrylamide, and the like can be given.

As examples of the amide group-containing compounds, formamide, N-methylformamide, N,N-dimethylformamide, acetamide, N-methylacetamide, N,N-dimethylacetamide, propioneamide, benzamide, pyrrolidone, N-methylpyrrolidone, and the like can be given.

As examples of the urea compounds, urea, methylurea, 1,1-dimethylurea, 1,3-dimethylurea, 1,1,3,3-tetramethylurea, 1,3-diphenylurea, tributylthiourea, and the like can be given.

Examples of the nitrogen-containing heterocyclic compounds include imidazoles such as imidazole, benzimicdazole, 4-methylimidazole, and 4-methyl-2-phenylimidazole, pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine, pyrazon, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2] octane, and the like.

Of these nitrogen-containing organic compounds, the nitrogen-containing compound ($\alpha$) and the nitrogen-containing heterocyclic compounds are preferable. Moreover, trialkylamines and pyridines are particularly preferable among the nitrogen-containing compound ($\alpha$) and among the nitrogen-containing heterocyclic compounds, respectively.

These acid diffusion controllers can be used either individually or in combinations of two or more.

The amount of the acid diffusion controllers to be used is usually 15 parts byweight or less, preferably 0.001–10 parts by weight, and particularly preferably 0.005–5 parts by weight for 100 parts by weight of the copolymer (A). If the amount exceeds 15 parts by weight, sensitivity as a resist as well as developability of the exposed part may be inferior. If the amount is less than 0.001 part by weight, a pattern profile or dimensional accuracy as a resist may be worse depending on the process conditions.

Alkali-soluble Resin

In the present invention, alkali-soluble resins can be added in addition to the copolymer (A), as required.

An alkali-soluble resin is a resin which is soluble in alkaline developers and has one or more functional groups affinitive to an alkaline developer. For example, acidic functional groups such as a carboxyl group and a phenolic hydroxyl group can be given as such functional groups. Because the dissolving rate of the resist film formed from the radiation-sensitive resin composition of the present invention in alkaline developers can be easily controlled by using such alkali-soluble resins, developability can be further improved.

There are no specific limitations to the alkali-soluble resins to be used as far as the resins are soluble in alkaline developers. As examples of the alkali-soluble resins, addition polymerized resins having at least one repeating unit formed by cleavage of a polymerizable carbon—carbon double bond of ethylenic unsaturated monomers having an acidic functional group, for example, hydroxystyrenes, isopropenyl phenols, vinylbenzoic acids, carboxymethylstyrenes, carboxymethoxystyrenes, (meth) acrylic acid, crotonic acid, maleic acid, fumaric acid, itaconic acid, citraconic acid, mesaconic acid, and cinnamic acid, polycondensed resins having at least one condensing repeating unit having an acidic functional group, which is represented by novolak resins, and the like can be given.

The above addition polymerized resins used as the alkali-soluble resins may further contain one or more repeating units other than the repeating unit formed by cleavage of a polymerizable carbon—carbon double bond of ethylenic unsaturated monomers having an acidic functional group.

As examples of such other repeating units, repeating units formed by cleavage of a polymerizable carbon—carbon double bond of, for example, styrene, $\alpha$-methylstyrene, vinyltoluenes, maleic anhydride, (meth)acrylonitrile, crotonitrile, maleinitrile, fumarnitrile, mesaconitrile, citraconitrile, itaconitrile, (meth)acrylamide, crotonamide, maleinamide, fumaramide, mesaconamide, citraconamide, itaconamide, vinylanilines, vinylpyridines, N-vinyl-$\epsilon$-caprolactam, N-vinyl pyrrolidone, N-vinyl imidazole, and the like can be given.

Of the above addition polymerized resins, poly (hydroxystyrene) and isopropenylphenol copolymers are particularly preferable in view of higher radiation permeability and superior resistance to dry etching when used as a resist film.

The above polycondensed resins used as the alkali-soluble resins may contain one or more condensing repeating units other than the condensing repeating unit having an acid functional group, as required.

Such polycondensed resins can be obtained by (co) polycondensing one or more phenols and one or more aldehydes with polycondensation components which can form other condensing repeating unit, as required, in the presence of an acidic or basic catalyst in an aqueous medium or a mixed medium of water and hydrophilic solvent.

As examples of the phenols, o-cresol, m-cresol, p-cresol, 2,3-xylenol, 2,4-xylenol, 2,5-xylenol, 3,4-xylenol, 3,5-xylenol, 2,3,5-trimethylphenol, 3,4,5-trimethylphenol, and the like can be given. As examples of the aldehydes, formaldehyde, trioxane, paraformaldehyde, benzaldehyde, acetaldehyde, propylaldehyde, phenylacetaldehyde, and the like can be given.

The Mw of the alkali-soluble resin is usually 1,000–100,000, preferably 3,000–50,000, and particularly preferably 3,000–30,000. If the Mw is less than 1,000, resolution as a resist may be insufficient. On the other hand, if the Mw exceeds 100,000, viscosity of the resist solution increases, whereby the film thickness of the coated areas may be nonuniform when the resist is applied to a substrate.

The above alkali-soluble resin can be used either individually or in combinations of two or more.

The amount of the alkali-soluble resins to be used is usually 200 parts by weight or less for 100 parts by weight of the copolymer (A). If the amount exceeds 200 parts by weight, resolution as a resist may be degraded.

Additives

Additives such as surfactants and photosensitizers can be added to the radiation-sensitive resin composition of the present invention, as required.

The surfactants improve coatability and striation of the composition, developability as a resist, and the like.

As examples of surfactants, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and the like can be given.

The amount of surfactant to be used is usually 2 parts by weight or less for 100 parts by weight of the copolymer (A)

The photosensitizers increase the amount of acid generated from the exposed photoacid generator (B) by absorbing the radiation energy and then transmitting the energy to the photoacid generator (B), whereby apparent sensitivity as a resist can be improved.

As examples of the photosensitizers, benzophenones, rose bengals, anthracenes, acetophenones, pyrenes, phenothiazines, and the like can be given.

Photosensitizers are usually used in the amount of 50 parts by weight for 100 parts by weight of the copolymer (A)

Moreover, combinations of dyes or pigments weaken the influence of halation at the time of exposure by visualizing the latent image of the exposed area, and adhesion improving agents ensure superior adhesion to a substrate.

Furthermore, other additives such as halation preventers, form improving agents, storage stabilizers, and anti-foaming agents can be combined.

Solvent

The radiation-sensitive resin composition of the present invention is prepared as the composition solution before use in practice. The composition solution is prepared by dissolving the composition uniformly in solvents so that the total solid concentration is usually 3–50 wt %, and preferably 5–40 wt %, followed by filtration using, for example, a filter having a pore diameter of about 0.2 μm.

Examples of solvents used in the preparation of the composition solution include: ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene lycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylates such as ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; esters such as 3-methoxymethyl propionate, 3-methoxyethyl propionate, 3-ethoxymethyl propionate, 3-ethoxyethyl propionate, methyl pyruvate, and ethyl pyruvate; aromatic hydrocarbons such as toluene and xylene; ketones such as 2-heptanone, 3-heptanone, 4-heptanone, and cyclohexanone; amides such as N,N-dimethylformamide, N-methylacetamide, N,N-dimethyhacetamide, and N-methylpyrrolidone; lactones such as γ-butyrolactone; and the like.

These solvents can be used either singly or in combinations of two or more.

Formation of Resist Pattern

A resist pattern is formed from the radiation-sensitive resin composition of the present invention according to the following process.

First, the resist films are formed by coating the above-described composition solution on a substrate such as a silicone wafer or a wafer coated with aluminum by using an appropriate coating method such as rotary coating, cast coating, or roll coating. Then, after the pre-heating treatment (hereinafter called "pre-bake") if necessary, the resist film is exposed via the fixed master pattern. As the radiation used in the above process, for example, ultraviolet rays such as i-rays (wavelength: 365 nm), far ultraviolet rays such as an ArF excimer laser (wavelength: 193 nm) and KrF excimer laser (wavelength: 248 nm), X-rays such as synchrotron radiation, and charged particle rays such as electron beams are suitably selected corresponding to types of the photoacid generator (B) The exposure conditions such as light exposure may vary according to the formulation of the composition, types of additives, and the like.

In the present invention, it is preferable to perform a post-bake in order to improve apparent sensitivity of the resist film. The heating temperature is usually 30–200° C., and preferably 40–150° C., although the temperature may vary according to the formulation of the composition, types of additives, and the like.

Then, the fixed resist pattern is formed by developing the exposed resist film using alkaline developers under the conditions of usually 30–200 seconds at 10–50° C.

As examples of the alkaline developers, alkaline aqueous solution wherein at least one compound selected from alkaline compounds such as mono-, di-, or tri-alkylamines, mono-, di-, or tri-alkanolamines, heterocyclic amines, tetraalkylammonium hydroxides, choline, 1,8-diazabicyclo[5.4.0]-7-undecene, 1,5-diazabicyclo[4.3.0]-5-nonene, and the like is dissoved so that the concentration is 1–10 wt %, and preferably 1–5 wt %.

A moderate amount of water soluble organic solvents such as methanol and ethanol or surfactants can be added to the developers consisting of the above alkaline aqueous solution.

When developers consisting of the alkaline aqueous solution are used, the resist is usually rinsed with water after development.

In the formation of a resist pattern, protective films can be provided on the resist film in order to prevent the influence of basic impurities and the like contained in the surrounding atmosphere.

The present invention will now be described in detail by way of examples, which should not be construed as limiting the present invention.

Methods of measuring the Mw and the Mn and evaluating the resists in Examples and Comparative Examples are described below.

Mw and Mn

The Mw and Mn were measured by gel permeation chromatography (GPC) based on monodispersed polystyrene as a standard using a GPC column (manufactured by Tosoh Corp.: G2000HXL×2, G3000HXL×1, G4000HXL×1) under the following conditions (flow rate: 1.0 ml/min., eluent: tetrahydrofuran, column temperature: 40° C.).

Sensitivity

Sensitivity of the resist was evaluated at an optimum light exposure at which a line and space pattern (1L1S) having a line width of 0.25 μm can be formed in a ratio one to one.

Resolution

Resolution of the resist was evaluated by a minimum dimension (μm) of the resist pattern resolved at an optimum light exposure.

Pattern Profile

In a 1L1S of a line width of 0.25 μm, when the cross section of the pattern is almost rectangle and the swing curve effect is scarcely observed, the pattern profile of the resist was rated as good.

Heat Resistance

The substrate on which a square pattern of 20 μm×20 μm was formed was heated after development and dried. Heat resistance was evaluated by an maximum temperature (° C.) at which the pattern profile was maintained while heating.

Other features of the invention will become apparent in the course of the following description of the exemplary embodiments which are given for illustration of the invention and are not intended to be limiting thereof.

EXAMPLES

Synthesis of Copolymer (A)

Synthesis Example 1

Propylene glycol monomethyl ether acetate (78 g) was added to a solution of t-butyl acrylate (23 g), 2,5-dimethyl- 2,5-hexanediol diacrylate (4 g), p-isopropenylphenol (27 g), and tricyclodecanyl acrylate (11 g) to prepare a homogeneous solution. Nitrogen gas was bubbled into this solution for 30 minutes. After the addition of 2,2'-azobisisobutyronitrile (3 g) and t-dodecylmercaptan (2 g), the solution was polymerized for 24 hours at 70° C. while continuing bubbling nitrogen gas. After polymerization, the solution was mixed with a large quantity of hexane to coagulate the resulting copolymer. The copolymer was then dissolved in dioxane, followed by coagulation in hexane. This dissolution-coagulation operation was repeated several times to remove unreacted monomers. The resultant product was dried for 24 hours at 50° C. under reduced pressure to obtain a white copolymer.

The Mw of the resulting copolymer was 101,000 and the Mw/Mn was 4.7. From the results of NMR measurements ($^{13}$C-NMR and $^{1}$H-NMR), the proportion (weight ratio) of monomers was confirmed to be t-butyl acrylate:2,5-dimethyl-2,5-hexanediol diacrylate:p-isopropenylphenol:tricyclodecanyl acrylate=35:6:42:17. This copolymer is referred to as the copolymer (A-1).

Synthesis Example 2

A white copolymer was obtained in the same manner as in Synthesis Example 1, except for using t-butyl acrylate (19 g), 2,5-dimethyl-2,5-hexanediol diacrylate (2 g), p-isopropenyl phenol (19 g), and isobornyl acrylate (10 g) as monomers.

The Mw of the resulting copolymer was 63,000 and the Mw/Mn was 3.8. From the results of NMR measurements ($^{13}$C-NMR and $^{1}$H-NMR), the proportion (weight ratio) of monomers was confirmed to be t-butyl acrylate:2,5-dimethyl-2,5-hexanediol diacrylate:p-isopropenylphenol:isobornyl acrylate=38:4:38:20. This copolymer is referred to as the copolymer (A-2).

Synthesis Example 3

Dioxane (200 g) was added to a solution of t-butyl acrylate (10 g), 2,5-dimethyl-2,5-hexanediol diacrylate (2 g), styrene (5 g), p-acetoxystyrene (46 g), and t-dodecylmercaptan (1 g) to prepare a homogeneous solution. Nitrogen gas was bubbled into this solution for 30 minutes. After the addition of 2,2'-azobisisobutyronitrile (2 g), the solution was polymerized for 7 hours at 70° C. while continuing bubbling nitrogen gas. After polymerization, the solution was mixed with a large quantity of hexane to coagulate the resulting copolymer. The copolymer was then dissolved in dioxane, followed by coagulation in hexane. This dissolution-coagulation operation was repeated several times to remove unreacted monomers. The resultant product was dried for 24 hours at 50° C. under reduced pressure to obtain a white copolymer.

This copolymer (24 g) was then mixed with methanol (240 g), triethylamine (15 g), and water (5 g). The solution was subjected to a hydrolysis reaction for 8 hours under refluxing while heating. The reactant solution was dropped into an aqueous solution of oxalic acid (1 wt %) to coagulate the copolymer. After rinsing with water, the resultant product was dried for 24 hours at 50° C. under reduced pressure to obtain a white copolymer.

The Mw of the resulting copolymer was 45,000 and the Mw/Mn was 4.2. From the results of NMR measurements ($^{13}$C-NMR and $^{1}$H-NMR), the proportion (weight ratio) of monomers was confirmed to be t-butyl acrylate:2,5-dimethyl-2,5-hexanediol diacrylate:styrene:p-hydroxystyrene=21:4:10:65. This copolymer is referred to as the copolymer (A-3).

Synthesis Example 4

Propylene glycol monomethyl ether (265 g) was added to a solution of p-t-butoxystyrene (30 g), 2,5-dimethyl-2,5-hexanediol diacrylate (4 g), and p-acetoxystyrene (95 g) to prepare a homogeneous solution. Nitrogen gas was bubbled into this solution for 30 minutes. After the addition of 2,2'-azobisisobutyronitrile (9g) and-dodecylmercaptan (6g), the solution was polymerized for 24 hours at 70° C. while continuing bubbling nitrogen gas. After polymerization, the solution was mixed with a large quantity of hexane to coagulate the resulting copolymer. The copolymer was then dissolved in acetone, followed by coagulation in hexane. This dissolution-coagulation reaction was repeated several times to remove unreacted monomers. The resultant product was dried for 24 hours at 50° C. under reduced pressure to obtain a white copolymer.

This copolymer (50 g) was then mixed with methanol (500 g), triethylamine (20 g), and water (10 g). The solution was subjected to a hydrolysis reaction for 8 hours under refluxing while heating. The reactant solution was dropped into an aqueous solution of oxalic acid (1 wt %) to coagulate the copolymer. After rinsing with water, the resultant product was dried for 24 hours at 50° C. under reduced pressure to obtain a white copolymer.

The Mw of the resulting copolymer was 38,000 and the Mw/Mn was 2.9. From the results of NMR measurements (13C-NMR and 1H-NMR), the proportion (weight ratio) of monomers was confirmed to be p-t-butoxystyrene:2,5-dimethyl-2,5-hexanediol diacrylate:p-hydroxystyrene= 31:4:65. This copolymer is referred to as the copolymer (A-4).

Synthesis Example 5

Propylene glycol monomethyl ether (100 g) was added to a solution of 2,5-dimethyl-2,5-hexanediol diacrylate (3 g) and p-acetoxystyrene (97 g) to prepare a homogeneous solution. Nitrogen gas was bubbled into this solution for 30 minutes. After the addition of 2,2'-azobisisobutyronitrile (6 g) and t-dodecylmercaptan (4 g), the solution was polymerized for 24 hours at 70° C. while continuing bubbling nitrogen gas. After polymerization, the reaction solution was mixed with a large quantity of hexane to coagulate the resulting copolymer. The copolymer was then dissolved in acetone, followed by coagulation in hexane. This operation was repeated several times to remove unreacted monomers. The resultant product was dried for 24 hours at 50° C. under reduced pressure to obtain a white copolymer.

This copolymer (60 g) was then mixed with methanol (500 g), triethylamine (20 g), and water (10 g). The solution was subjected to a hydrolysis reaction for 8 hours under refluxing while heating. The reactant solution was dropped into an aqueous solution of oxalic acid (1 wt %) to coagulate the copolymer. After rinsing with water, the resultant product was dried for 24 hours at 50° C. under reduced pressure to obtain a white copolymer. After this copolymer (24 g) was dissolved in dioxane (100 g), nitrogen gas was bubbled into the solution for 30 minutes. This solution was subjected to acetalization for 12 hours with the addition of ethyl vinyl ether (4.5 g) and pyridinium p-toluenesulfonate (0.4 g) as a catalyst. The reactant solution was then added dropwise to 1 wt % aqueous ammonia solution to coagulate the reactant. After rinsing with water, the resultant product was dried for 24 hours at 50° C. under reduced pressure to obtain a white copolymer.

The Mw of the resulting copolymer was 52,000 and the Mw/Mn was 3.4. From the results of NMR measurements (13C-NMR and 1H-NMR), the proportion (weight ratio) of monomers was confirmed to be 2,5-dimethyl-2,5-hexanediol diacrylate:p-hydroxystyrene:p-(1-ethoxyethoxy)styrene= 4:66:30. This copolymer is referred to as the copolymer (A-5).

Synthesis Example 6

Propylene glycol monomethyl ether (100 g) was added to a solution of 2,5-dimethyl-2,5-hexanediol diacrylate (5 g) and p-acetoxystyrene (95 g) to prepare a homogeneous solution. Nitrogen gas was bubbled into this solution for 30 minutes. After the addition of 2,2'-azobisisobutyronitrile (6 g) and t-dodecylmercaptan (4 g), the solution was polymerized for 24 hours at 70° C. while continuing bubbling nitrogen gas. After polymerization, the reactant solution was mixed with a large quantity of hexane to coagulate the copolymer. The copolymer was then dissolved in acetone, followed by coagulation in hexane. This dissolution-coagulation operation was repeated several times to remove unreacted monomers. The resultant product was dried for 24 hours at 50° C. under reduced pressure to obtain a white copolymer.

This copolymer (60 g) was then mixed with methanol (500 g), triethylamine (20 g), and water (10 g). The solution was subjected to a hydrolysis reaction for 8 hours under refluxing while heating. The reactant solution was dropped into an aqueous solution of oxalic acid (1 wt %) to coagulate the copolymer. After rinsing with water, the resultant product was dried for 24 hours at 50° C. under reduced pressure to obtain a white copolymer. This copolymer (24 g) was then dissolved in dioxane (100 g), followed by nitrogen gas bubbling for 30 minutes. After the addition of triethylamine (5 g), di-t-butyl dicarbonate (10 g) was then added at 45° C. while stirring, followed by a reaction for 6 hours. The reactant solution was dropped into an aqueous solution of oxalic acid (1 wt %) to coagulate the copolymer. After rinsing with water, the resultant product was dried for 24 hours at 50° C. under reduced ressure to obtain a white copolymer.

The Mw of the resulting copolymer was 73,000 and the Mw/Mn was 4.3. From the results of NMR measurements (13C-NMR and 1H-NMR), the proportion (weight ratio) of monomers was confirmed to be 2,5-dimethyl-2,5-hexanediol diacrylate:p-hydroxystyrene:p-t-butoxycarbonyloxystyrene=6:69:25. This copolymer is referred to as the copolymer (A-6).

Synthesis Example 7

A white copolymer was obtained in the same manner as in Synthesis Example 1, except for using t-butyl acrylate (23 g), a monomer of the following formula (8) having a carbonate group (2) (hereinafter called "monomer (8)") (4 g), p-isopropenylphenol (27 g), and tricyclodecanyl acrylate (11 g) as monomers.

The Mw of the resulting copolymer was 85,000 and the Mw/Mn was 4.5. From the results of NMR measurements (13C-NMR and 1H-NMR), the proportion (weight ratio) of monomers was t-butyl acrylate:monomer (8):p-isopropenyl phenol:tricyclodecanyl acrylate=35:6:42:17. This copolymer is referred to as the copolymer (A-7).

Comparative Synthesis Example 1

Dioxane (200 g) was added to a solution of t-butyl acrylate (10 g), styrene (5 g), p-acetoxystyrene (50 g), and t-dodecyl mercaptan (0.4 g) to prepare a homogeneous solution. Nitrogen gas was bubbled into this solution for 30 minutes. After the addition of 2,2'-azobisisobutyronitrile (2 g), the solution was polymerized for 7 hours at 70° C. while continuing bubbling nitrogen gas. After polymerization, the solution was mixed with a large quantity of hexane to coagulate the copolymer. The copolymer was then dissolved in dioxane, followed by coagulation in hexane. This dissolution-coagulation operation was repeated several times to remove unreacted monomers. The resultant product was dried for 24 hours at 50° C. under reduced pressure to obtain a white copolymer.

This copolymer (24 g) was then mixed with methanol (240 g), triethylamine (15 g), and water (5 g). The solution was subjected to a hydrolysis reaction for 8 hours under refluxing while heating. The reactant solution was dropped into an aqueous solution of oxalic acid (1 wt %) to coagulate the copolymer. After rinsing with water, the resultant product was dried for 24 hours at 50° C. under reduced pressure to obtain a white copolymer.

The Mw of the resulting copolymer was 12,000 and the Mw/Mn was 1.6. From the results of NMR measurements ($^{13}$C-NMR and 1H-NMR), the proportion (weight ratio) of monomers was confirmed to be t-butyl acrylate:styrene:p-hydroxystyrene=21:10:69. This copolymer is referred to as the copolymer (a-1).

Examples 1–6 and Comparative Example 1

According to the formulations (parts by weight) of Table 1, components were mixed to prepare a homogeneous solution. The solution was then filtered through a membrane filter (pore diameter: 0.2 $\mu$m) to prepare a composition solution.

After coating a silicone wafer with each composition solution by spin coating, pre-bake (PB) was performed for 90 seconds at a temperature as shown in Table 2 to form the resist film (film thickness: 0.7 $\mu$m).

After exposure using a KrF excimer laser stepper (manufactured by Nikon: stepper NSR-2005 EX8A), post-bake (PEB) was performed for 60 seconds at a temperature as shown in Table 2. After the alkali development in an aqueous solution of tetramethylammonium hydroxide (2.38 wt %) by using a puddle method for 1 minute at 23° C., the resist film was rinsed with purified water, followed by drying to form a resist pattern.

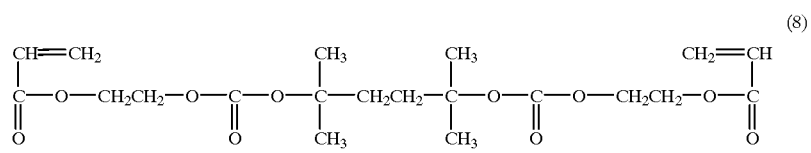

(8)

The evaluation results of the resists are shown in Table 2.

Components used other than the copolymers in Table 1 are as follows.

Acid Generator
B-1: Triphenylsulfonium nonafluorobutane sulfonate
B-2: Bis(cyclohexylsulfonyl)diazomethane
B-3: Bis(4-t-butylphenyl)iodonium camphorsulfonate
Acid Diffusion Controller
C-1: Tri-n-octylamine
C-2: n-Dodecyldimethylamine
Solvent
D-1: Ethyl lactate
D-2: Propylene glycol monomethyl ether acetate

TABLE 1

|  | Copolymer (part) | Acid generator (part) | Acid diffusion controller (part) | Solvent (part) |
|---|---|---|---|---|
| Example 1 | A-1 (100) | B-1 (1.5) | C-1 (0.15) | D-1 (600) |
| Example 2 | A-2 (100) | B-1 (1.5) | C-1 (0.15) | D-1 (600) |
| Example 3 | A-3 (100) | B-1 (1.5) | C-1 (0.15) | D-1 (600) |
| Example 4 | A-4 (100) | B-1 (1.5) | C-1 (0.15) | D-1 (600) |
| Example 5 | A-5 (100) | B-2 (6.0) | C-1 (0.20) | D-2 (600) |
| Example 6 | A-6 (100) | B-1 (1.5) | C-1 (0.15) | D-1 (600) |
| Example 7 | A-7 (100) | B-1 (1.5) | C-1 (0.15) | D-1 (600) |
| Example 8 | A-1 (100) | B-3 (3.5) | C-1 (0.15) | D-1 (600) |
| Example 9 | A-3 (100) | B-3 (3.5) | C-1 (0.15) | D-1 (600) |
| Comparative Example 1 | a-1 (100) | B-1 (1.5) | C-1 (0.15) | D-1 (450) |

TABLE 2

|  | Copolymer | PB (° C.) | PEB (° C.) | Sensitivity (mJ/cm$^2$) | Resolution ($\mu$m) | Pattern Profile | Heat resistance (° C.) |
|---|---|---|---|---|---|---|---|
| Example 1 | A-1 | 140 | 140 | 24.3 | 0.20 | Good | 140 |
| Example 2 | A-2 | 140 | 140 | 26.1 | 0.20 | Good | 135 |
| Example 3 | A-3 | 140 | 140 | 27.5 | 0.20 | Good | 135 |
| Example 4 | A-4 | 140 | 110 | 24.0 | 0.20 | Good | 130 |
| Example 5 | A-5 | 100 | 110 | 35.6 | 0.20 | Good | 130 |
| Example 6 | A-6 | 100 | 110 | 32.5 | 0.20 | Good | 135 |
| Example 7 | A-7 | 100 | 110 | 25.2 | 0.20 | Good | 135 |
| Example 8 | A-1 | 140 | 140 | 26.0 | 0.20 | Good | 140 |
| Example 9 | A-3 | 140 | 140 | 25.5 | 0.20 | Good | 140 |
| Comparative Example 1 | a-1 | 140 | 140 | 27.3 | 0.23 | Largely affected by swing curve | 125 |

The radiation-sensitive resin composition of the present invention exhibits excellent sensitivity and resolution, little effect from the swing curves, excellent pattern profile, and superior heat resistance, and is sensitive to ultraviolet rays, far ultraviolet rays, X-rays, and various types of radiation such as charged particle rays. Accordingly, the radiation-sensitive resin composition can be suitably used as a chemically amplified positive tone resist used in the manufacture of integrated circuit devices, which will be more and more miniaturized.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
   (A) a copolymer which comprises (a) a repeating unit (I) formed by cleavage of a carbon—carbon double bond of a monomer having one polymerizable carbon—carbon double bond and (b) a repeating unit (II) formed by cleavage of a carbon—carbon double bond of a monomer having two or more polymerizable carbon—carbon double bonds and at least one divalent group decomposed by an acid of the following formulas (1) or (2),

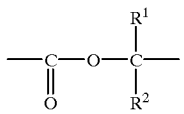

(1)

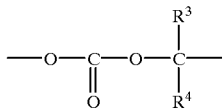

(2)

wherein $R^1$, $R^2$, $R^3$ and $R^4$ are an alkyl group having 1–5 carbon atoms or an aryl group having 6–14 carbon atoms individually, said monomer having a structure in which each carbon—carbon double bond combines via said divalent group, and (B) a photoacid generator, wherein said repeating unit (I) comprises a repeating unit (I-1') which provides alkali-solubility for the copolymer (A), and has a phenolic hydroxy group in the unit.

2. The radiation-sensitive resin composition according to claim 1, wherein the repeating unit (II) is derived from a monomer having at least one divalent ester group of the formula (1) or a monomer having one divalent carbonate group of the formula (2).

3. The radiation-sensitive resin composition according to claim 2, wherein the monomer having at least one divalent ester group of the formula (1) comprises a monomer produced from a polyhydric alcohol having at least one tertiary hydroxyl group and a monovalent carboxylic acid having one polymerizable carbon—carbon double bond.

4. The radiation-sensitive resin composition according to claim 2, wherein the monomer having one divalent carbonate group of the formula (2) comprises a compound produced by converting a polyhydric alcohol having at least one tertiary hydroxyl group into a poly(chloroformate), then reacting the poly(chloroformate) with a monohydric alcohol having one polymerizable carbon—carbon double bond.

5. The radiation-sensitive resin composition according to claim 3 or claim 4, wherein said polyhydric alcohol having at least one tertiary hydroxyl group is selected from the group consisting of the compounds of the following general formulas (3) to (5):

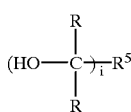
(3)

wherein Rs are the same groups as $R^1$, $R^2$, $R^3$, and $R^4$ defined for the formulas (1) and (2), provided that a plural R may be the same or different, $R^5$ is an organic group with a valence of i, provided that $R^5$ is a single bond when i=2, and i is an integer from 2–4;

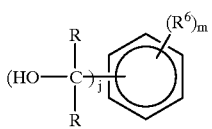
(4)

wherein Rs are the same groups as $R^1$, $R^2$, $R^3$, and $R^4$ defined for the formulas (1) and (2), provided that a plural R may be the same or different, $R^6$ is an alkyl group having 1–5 carbon atoms, provided that a plural $R^6$ may be the same or different, j is an integer of 2–4, and m is an integer from 0–4, provided that j and m satisfy the relation of j+m≦6; and

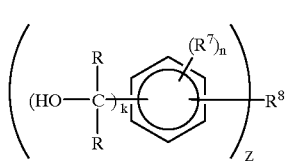
(5)

wherein Rs are the same groups as $R^1$, $R^2$, $R^3$, and $R^4$ defined for the formulas (1) and (2), provided that a plural R may be the same or different, $R^7$ is an alkyl group having 1–5 carbon atoms, provided that a plural $R^7$ may be the same or different, $R^8$ is an organic group with a valence of z, —O—, —S—, —CO—, or —SO$_2$—, k is an integer from 1–2, n is an integer from 0–3, and z is an integer from 2–4.

6. The radiation-sensitive resin composition according to claim 3, wherein said monovalent carboxylic acid having one polymerizable carbon—carbon double bond is selected from the group consisting of (meth)acrylic acid, crotonic acid, cinnamic acid, maleic acid, fumaric acid, itaconic acid, 2-(meth)acryloyloxyethylcarboxylic acid, and 4-(meth)acryloyloxycyclohexylcarboxylic acid.

7. The radiation-sensitive resin composition according to claim 1, wherein the content of the repeating unit (I) and the content of the repeating unit (II) in the copolymer (A) is respectively 60–99 wt % and 1–40 wt %.

8. The radiation-sensitive resin composition according to claim 1, wherein the copolymer (A) has a polystyrene-reduced weight average molecular weight of 10,000–500,000.

9. The radiation-sensitive resin composition according to claim 1, wherein the copolymer (A) has a ratio of the polystyrene-reduced weight average molecular weight and the polystyrene-reduced number average molecular weight in the range of 1.5 to 10.0.

10. The radiation-sensitive resin composition according to claim 1, wherein the photoacid generator (B) is selected from the group consisting of ① onium salt compounds, ② sulfone compounds, ③ sulfonate compounds, ④ sulionimide compounds, and ⑤ diazomethane compounds.

11. The radiation-sensitive resin composition according to claim 1, wherein the content of the photoacid generator (B) is 1–20 parts by weight for 100 parts by weight of the copolymer (A).

12. The radiation-sensitive resin composition according to claim 1, further comprising an acid diffusion controller which controls diffusion of acids generated from the photoacid generator (B) in the resist film.

13. The radiation-sensitive resin composition according to claim 12, wherein the acid diffusion controller is selected from the group consisting of nitrogen-containing organic compounds of the following formula, $$R^{12}R^{13}R^{14}N$$

(wherein $R^{12}$, $R^{13}$, and $R^{14}$ are a hydrogen atom, alkyl group, aryl group, or aralkyl group independently), diamino compounds having two nitrogen atoms in the molecule, polymers having more than three nitrogen atoms, amide group-containing compounds, urea compounds, and nitrogen-containing heterocyclic compounds.

14. The radiation-sensitive resin composition according to claim 1, further containing an alkali-soluble resin has one or more functional groups affinitive to an alkaline developer.

15. The radiation-sensitive resin composition according to claim 1, further containing a surfactant and a photosensitizer.

16. The radiation-sensitive resin composition according to claim 1, in a form of a solution which is prepared by dissolving the composition uniformly in a solvent so that the total solid concentration is 3–50 wt %.

17. The radiation-sensitive resin composition according to claim 1, wherein the monomer providing the repeating unit (I-1') is at least one selected from the group consisting of o-hydroxystyrene, m-hydroxystyrene, p-hydroxystyrene, o-isopropyl phenol, m-isopropyl phenol and p-isopropyl phenol.

18. The radiation sensitive resin composition according to claim 17, wherein the monomer is at least one selected from the group consisting of p-hydroxystyrene and p-isopropyl phenol.

19. The radiation-sensitive resin composition according to claim 1, wherein the repeating unit (I) further comprises a repeating unit (I-2) which provides alkali-solubility for the copolymer (A) by decomposition with an acid.

20. The radiation-sensitive resin composition according to claim 19, wherein the monomer providing the repeating unit (I-2) is at least one which forms an acidic functional group selected from the group consisting of a carboxyl group and a phenolic hydroxy group by decomposition with an acid.

21. The radiation-sensitive resin composition according to claim 1, wherein the repeating unit (I) further comprises a repeating unit (I-3) which suppresses alkali-solubility of the copolymer (A).

22. The radiation-sensitive resin composition according to claim 21, wherein the monomer providing the repeating unit (I-3) is at least one selected from the group consisting of aromatic vinyl compounds, hetero atom-containing alicyclic vinyl compounds, cyano group-containing vinyl compounds and (meth)acrylamides.

23. The radiation-sensitive resin composition according to claim 1, wherein the content of the repeating unit (I) and the content of the repeating unit (II) in the copolymer (A) is 94–99% by weight and 1–6% by weight, respectively.

* * * * *